United States Patent [19]
Woo et al.

[11] Patent Number: 5,926,711
[45] Date of Patent: Jul. 20, 1999

[54] METHOD OF FORMING AN ELECTRODE OF A SEMICONDUCTOR DEVICE

[75] Inventors: Sang Ho Woo, Ichon; Seong Su Lim, Seoul; Il Keoun Han, Ichon, all of Rep. of Korea

[73] Assignee: Hyundai Electronics Industries, Ltd., Kyungki-do, Rep. of Korea

[21] Appl. No.: 08/992,311

[22] Filed: Dec. 23, 1997

[30] Foreign Application Priority Data

Dec. 28, 1996 [KR] Rep. of Korea ............ 96-74982

[51] Int. Cl.⁶ .................................. H01L 21/8247
[52] U.S. Cl. ................ 438/260; 438/964; 438/398
[58] Field of Search ............... 438/259–267, 438/964

[56] References Cited

U.S. PATENT DOCUMENTS 5,597,756   1/1997   Fazan et al. .

*Primary Examiner*—Jey Tsai
*Attorney, Agent, or Firm*—Scott C. Harris, Esq.

[57] ABSTRACT

This invention discloses a method of forming an electrode of semiconductor device. In the present invention, an amorphous silicon film is formed on a substrate, and silicon seeds are formed on the silicon film. Thereinafter, the heat treatment is performed for growing, thereby forming an hemispherical roughness structure on surface of said charge storage electrode and increasing a surface area in unit area.

6 Claims, 6 Drawing Sheets

METHOD OF FORMING AN ELECTRODE OF A SEMICONDUCTOR DEVICE

FIELD OF THE INVENTION

The present invention relates to a method of forming an electrode of a semiconductor device which can have an enough capacitance in an narrow area of cell.

BACKGROUND OF THE INVENTION

Description of the Prior Art

In general, as the semiconductor device becomes highly integrated, size of the unit cell becomes smaller. However, although the semiconductor device such as DRAM, SRAM or flash memory device become highly integrated, it is desirable to ensure the capacitance for operating the cell and to minimize an area occupied by the capacitor. To realize this object, a manufacturing technology must be developed and a reliability of the device must be ensured preferentially.

Capacitance of the capacitor is expressed by the equation given below;

$$Q=\epsilon_0\epsilon_1 \times A/d$$

wherein,

Q is capacitance;

$\epsilon_0$ is a dielectric constant (air);

$\epsilon_1$ is a dielectric constant of dielectric material;

d is a thickness of film; and

A is surface area of capacitor.

Methods for increasing the capacitance defined by the above equation and disadvantages thereof are described.

First, there is a way to use a dielectric material having a high dielectric constant for forming the capacitor. However, if the dielectric material having a high dielectric constant is used for a dielectric film of the capacitor, a leakage current is increased. Also, it is difficult to make the dielectric material having a high dielectric constant.

Second, there is a way to be lowered a thickness of the dielectric film in the capacitor. In general, an ONO film consisted of a silicon oxide film, silicon nitride film and silicon oxide film is used as the dielectric film. However, if a thickness of the ONO film is 40 Å and less, the leakage current is increased, and a breakdown phenomenon occurs easily so that the it is difficult to maintain the stable capacitance.

Third, there is a way to increase a surface area of the capacitor. In order to increase a surface of an electrode in the capacitor, it is desirable that the charge storage electrode has 3 dimensional structure. However, this way causes to increase a topology between the electrode and peripheral element, and the method of forming 3 dimensional structure complicates.

To solve these problems, a method of controlling a microstructure of a polysilicon film consisting an electrode is developed for forming the polysilicon film having an hemispherical roughness structure on surface thereof. However, for forming the polysilicon film having the hemispherical roughness structure formed on surface, a doping process using $POCl_3$ and an etch back process for isolating cells must be performed after depositing a polysilicon film having an hemispherical roughness structure.

SUMMARY OF THE INVENTION

Therefore, it is an object of the present invention to provide a method of an electrode which has a hemispherical roughness structure on surface thereof for increasing a surface area and securing a sufficient capacitance in the narrow cell area.

In the method of forming a charge storage electrode according to the present invention to achieve this object, an amorphous silicon film is formed on the silicon substrate on which a junction region and contact hole are formed and then patterned to form a charge storage electrode. Then, silicon seeds are formed on the charge storage electrode, a heat treatment is performed for growing the silicon seeds, therefore, an hemispherical roughness structure is formed on surface of the charge storage electrode.

In the method of forming an electrode of the flash memory device according to the present invention, an amorphous silicon film is formed on a silicon substrate on which an oxide film is formed, and then silicon seeds are formed on amorphous silicon film. And then, a heat treatment is performed for growing the silicon seeds, therefore, an hemispherical roughness structure is formed on surface of the amorphous silicon film. Thereinafter, a dielectric film and polysilicon film are formed sequentially on the amorphous silicon film, then, the polysilicon film, dielectric film and the amorphous silicon are patterned, thereby forming a gate electrode consisted of a floating gate and control gate.

BRIEF DESCRIPTION OF THE DRAWINGS

For fuller understanding of the nature and objects of the present invention, reference should be had to the following detailed description taken in conjunction with the accompanying drawings in which.

DETAILED DESCRIPTION OF THE INVENTION

FIG. 1A to FIG. 1E are sectional views of device for illustrating a method of forming a charge storage electrode according to the first embodiment of the present invention.

Figure 1A:
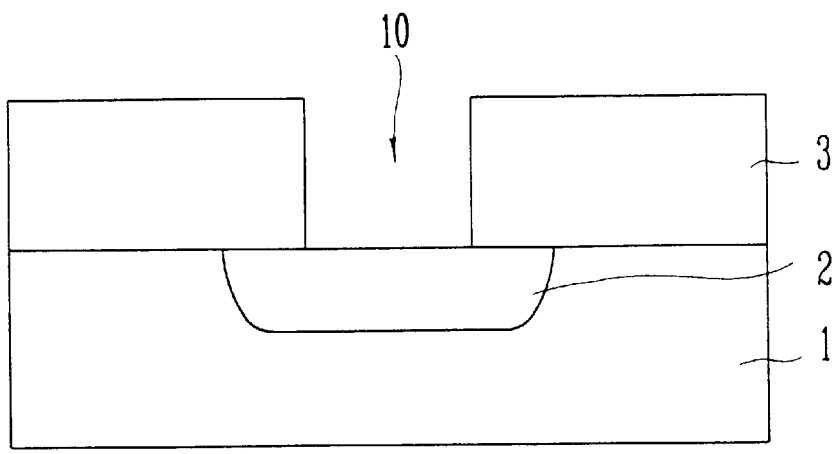
FIG. 1A to FIG. 1E are sectional views of device for illustrating a method of forming a charge storage electrode according to the first embodiment of the present invention.

Referring to FIG. 1A, an insulating film 3 is formed on a silicon substrate 1 on which a junction region 2 is formed. A portion of the insulating film 3 is etched to expose the junction region 2, thereby forming a contact hole 10.

Figure 1B:
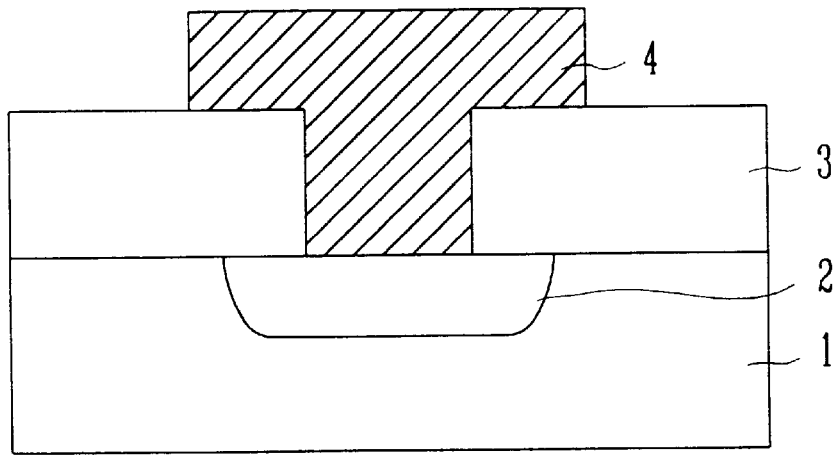

In FIG. 1B, a doped or undoped amorphous silicon film is formed on a entire structure of the silicon substrate 1 by use of at least one reaction gas of $Si_2H_6$ gas, $SiH_4$ gas, $Si_2H_6$+$PH_3$ gas, $SiH_4$+$PH_3$ gas, $Si_2H_6$+$AsH_3$ gas and $SiH_4$+$AsH_3$ gas, and then patterned, thereby forming a charge storage electrode 4.

Figure 1C:
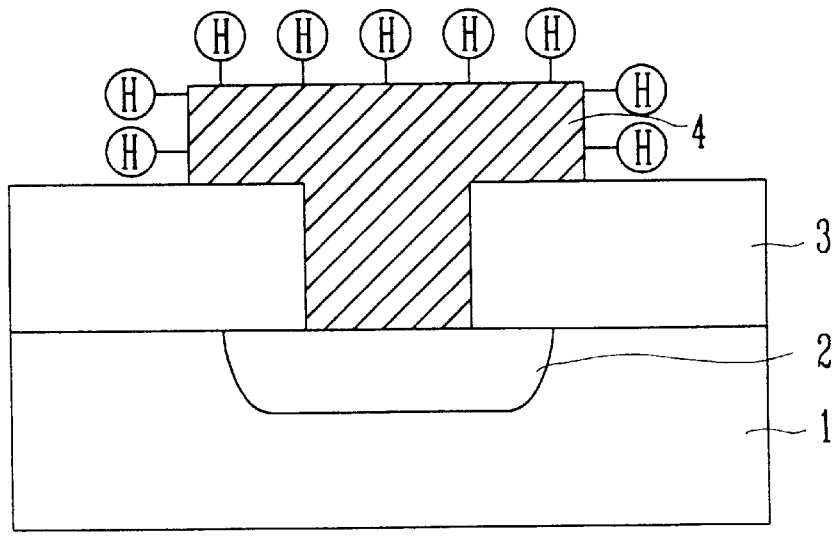

Referring to FIG. 1C, a native oxide film (not shown) formed on the charge storage electrode 4 is removed through cleaning process. In the cleaning process, the native oxide film and the insulating film 3 are etched with etching rate of 3 through 5:1. For example, That is, a gas phase oxide etching process using a mixing gas of HF gas and $H_2O$ or HF gas and $CH_3$ OH gas is performed, or an wet etching process using etchant of HF or BOE may be performed for removing the native oxide film. After cleaning process, hydrogen (H)

bonds to surface of the charge storage electrode 4 in dangling bond type.

Figure 1D:
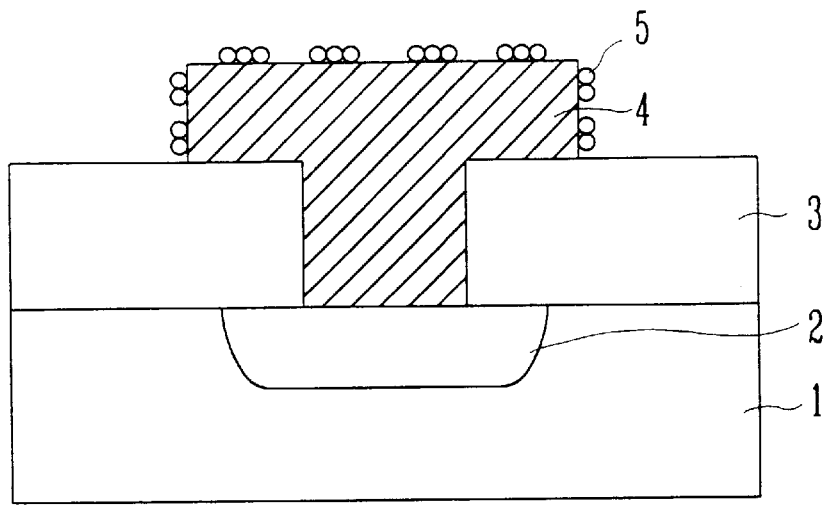

FIG. 1D shows that silicon seeds 5 are formed selectively on the charge storage electrode 4. A process for forming the silicon seeds 5 is performed in the furnace. $Si_2H_6$ gas or $SiH_4$ gas with flow rate of 10 through 60 sccm is supplied into the furnace in which a pressure is 10E-9 through 10E-5 Torr and a temperature is 500 through 750 degree Celsius. The silicon seeds 5 are formed on the only surface of the charge storage electrode 4 through the this process. That is, the silicon seeds 5 are not formed on the exposed insulating film 3.

Figure 1E:
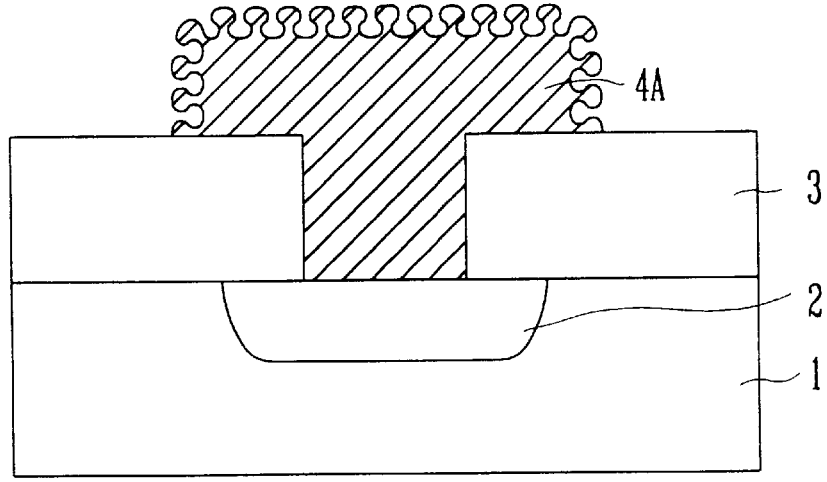

Referring to FIG. 1E, after forming the silicon seeds 5, a heat treatment is performed to the entire structure. The heat treatment is preformed in condition of a pressure of 10E-9 through 10E-6 Torr and a temperature of 500 through 800 degree Celsius. When the heat treatments is performed, the silicon seeds 5 receive silicon atoms from the charge storage electrode 4 formed of an amorphous silicon, and grow to silicon grains having an hemispherical shape. As a result, the charge storage electrode 4 as shown in FIG. 1A is change to a charge storage electrode 4A having an hemispherical roughness structure formed on surface thereof, as shown in FIG. 1E.

Thereinafter, a dielectric film and plate electrode are formed sequentially on the charge storage electrode 4A, thereby forming a capacitor.

FIG. 2A to FIG. 2F are sectional views of device for illustrating a method of forming a charge storage electrode according to the second embodiment of the present invention.

Figure 2A:
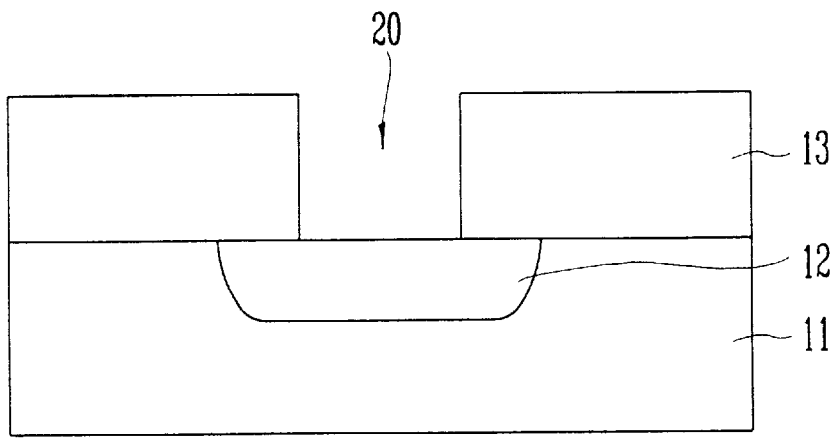
FIG. 2A to FIG. 2F are sectional views of device for illustrating a method of forming a charge storage electrode according to the second embodiment of the present invention.

Referring to FIG. 2A, an insulating film 13 is formed on a silicon substrate 11 on which a junction region 12 is formed. A portion of the insulating film 13 is etched to expose the junction region 12, thereby forming a contact hole 20.

Figure 2B:
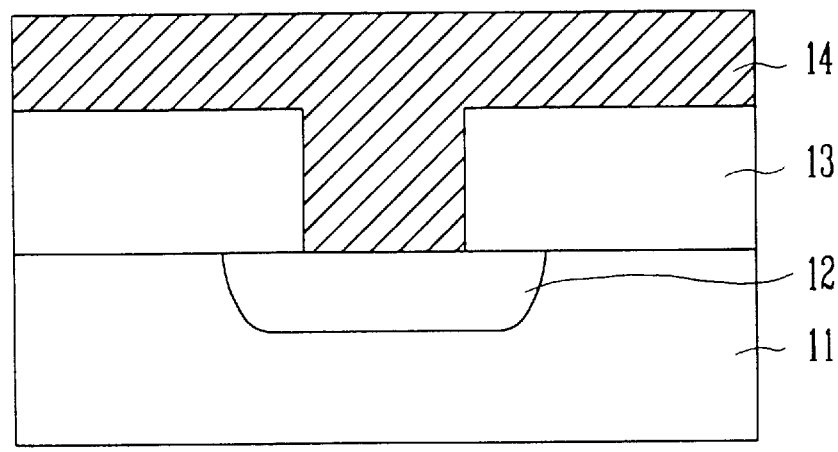

In FIG. 2B, a doped or undoped amorphous silicon film 14 is formed on a entire structure of the silicon substrate 11 by use of at least one reaction gas of $Si_2H_6$ gas, $SiH_4$ gas, $Si_2H_6+PH_3$ gas, $SiH_4+PH_3$ gas, $Si_2H_6+AsH_3$ gas and $SiH_4+AsH_3$ gas.

Figure 2C:
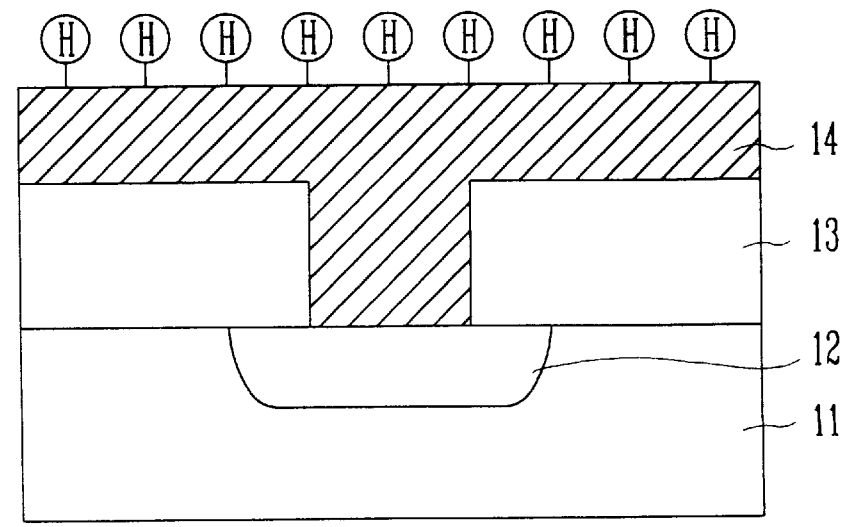

Referring to FIG. 2C, a native oxide film (not shown) formed on the amorphous silicon film 14 is removed through cleaning process. In the cleaning process, a gas phase oxide etching process using a mixing gas of HF and $H_2O$ or HF and $CH_3OH$ is performed, or an wet etching process using etchant of HF or BOE may be performed for removing the native oxide film. After cleaning process, hydrogen (H) bonds to surface of the amorphous silicon film 14 in dangling bond type.

Figure 2D:
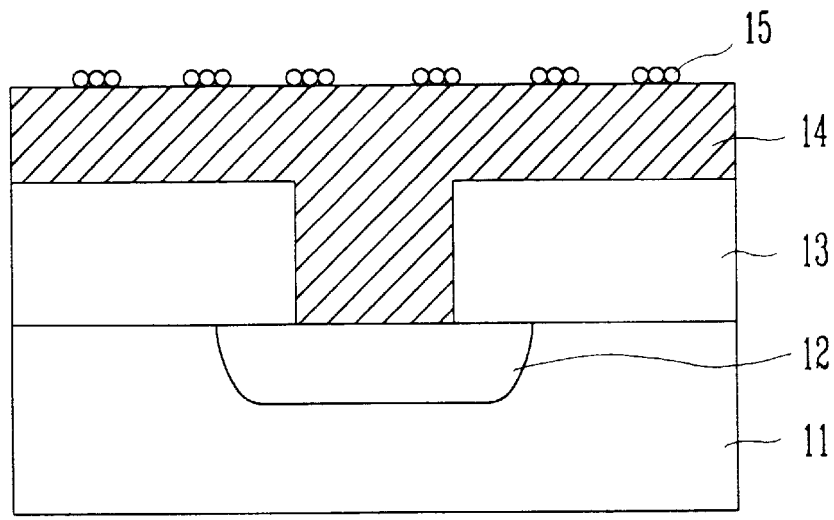

FIG. 2D shows that silicon seeds 15 are formed selectively on the amorphous silicon film 14. A process for forming the silicon seeds 15 is performed in the furnace. $Si_2H_6$ gas or $SiH_4$ gas with flow rate of 10 through 100 sccm is supplied into the furnace in which a pressure is 10E-9 through 10E-5 Torr and a temperature is 500 through 750 degree Celsius. The silicon seeds 15 are formed on the surface of the amorphous silicon film 14 through the this process.

Figure 2E:
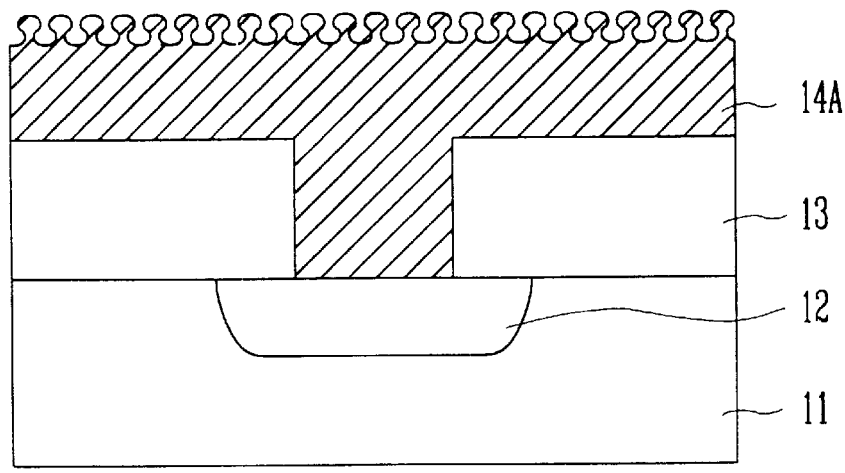
Figure 2F:
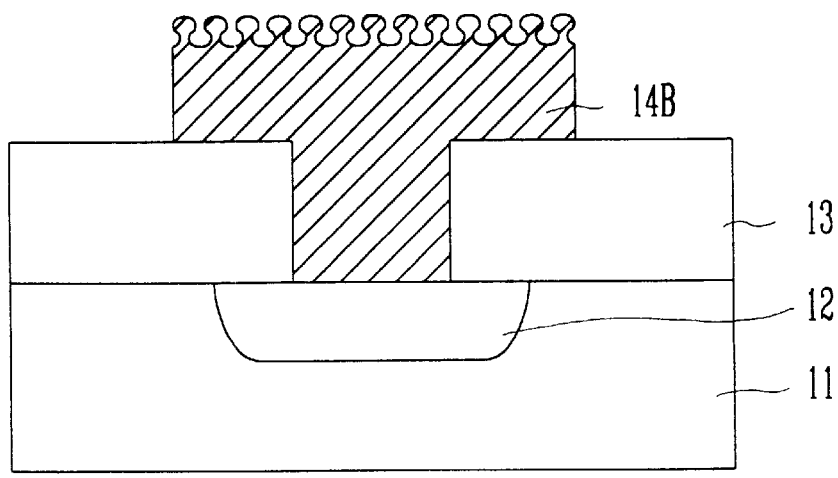

Referring to FIG. 2E, after forming the silicon seeds 15, a heat treatment is performed to the entire structure. The heat treatment is preformed in condition of a pressure of 10E-9 through 10E-6 Torr and a temperature of 500 through 800 degree Celsius. When the heat treatments is performed, the silicon seeds 15 receive silicon atoms from the amorphous silicon film 14, and grow to silicon grains having an hemispherical shape. As a result, the amorphous silicon film 14, as shown in FIG. 2A, is change to a amorphous silicon film 14A having an hemispherical roughness structure formed on surface thereof, as shown in FIG. 2E.

Thereinafter, the amorphous silicon film 14A is patterned to form a charge storage electrode 14B perfectly, a dielectric film and plate electrode are formed sequentially on the charge storage electrode 14B, thereby forming a capacitor.

FIG. 3A to FIG. 3F are sectional views for illustrating a method of forming an electrode of flash memory device according to the third embodiment of the present invention.

Figure 3A:
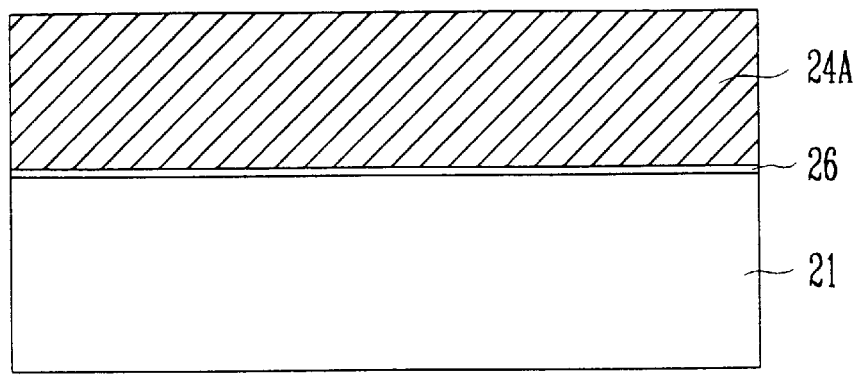
FIG. 3A to FIG. 3F are sectional views of device for illustrating a method of forming an electrode according to the third embodiment of the present invention.

Referring to FIG. 3A, a silicon film 24A formed of a doped or undoped amorphous silicon is formed on a silicon substrate 21 on which an oxide film 26 is formed. The silicon film 24A is formed by use of at least one reaction gas of $Si_2H_6$ gas, $SiH_4$ gas, $Si_2H_6+PH_3$ gas, $SiH_4+PH_3$ gas, $Si_2H_6+AsH_3$ gas and $SiH_4+AsH_3$ gas.

Figure 3B:
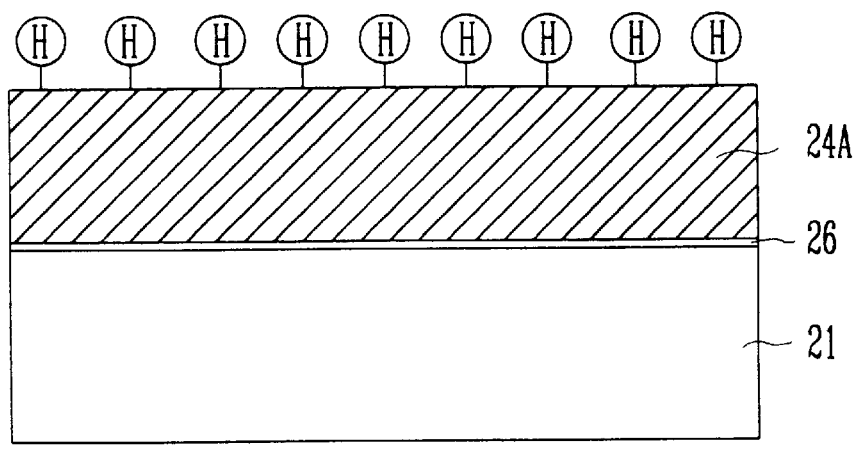

Referring to FIG. 3B, a native oxide film (not shown) formed on the silicon film 24A is removed through cleaning process. In the cleaning process, a gas phase oxide etching process using a mixing gas of HF and $H_2O$ or HF and $CH_3OH$ is performed, or an wet etching process using etchant of HF or BOE may be performed for removing the native oxide film. After cleaning process, as shown in FIG. 3B, hydrogen (H) bonds to surface of the silicon film 24A in dangling bond type.

Figure 3C:
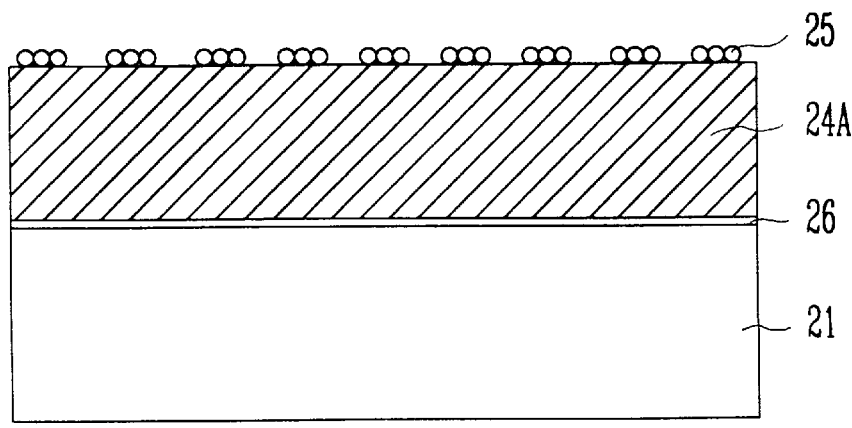

FIG. 3C shows that silicon seeds 25 are formed selectively on the silicon film 24A. A process for forming the silicon seeds 25 is performed in the furnace. $Si_2H_6$ gas or $SiH_4$ gas with flow rate of 10 through 100 sccm is supplied into the furnace in which a pressure is 10E-9 through 10E-5 Torr and a temperature is 500 through 750 degree Celsius.

Figure 3D:
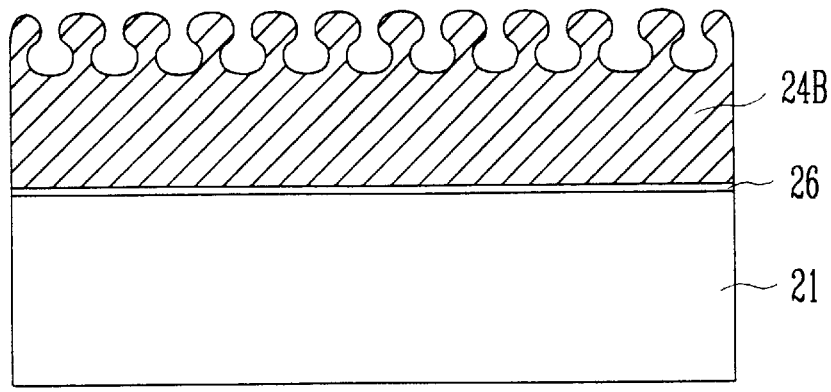

Referring to FIG. 3D, after forming the silicon seeds 25, a heat treatment is performed to the entire structure. The heat treatment is preformed in condition of a pressure of 10E-9 through 10E-6 Torr and a temperature of 500 through 800 degree Celsius. When the heat treatments is performed, the silicon seeds 25 receive silicon atoms from the silicon film 25A formed of an amorphous silicon, and grow to silicon grains having an hemispherical shape. As a result, the hemispherical roughness structure is formed on surface of the silicon film 25B, as shown in FIG. 3D.

Figure 3E:
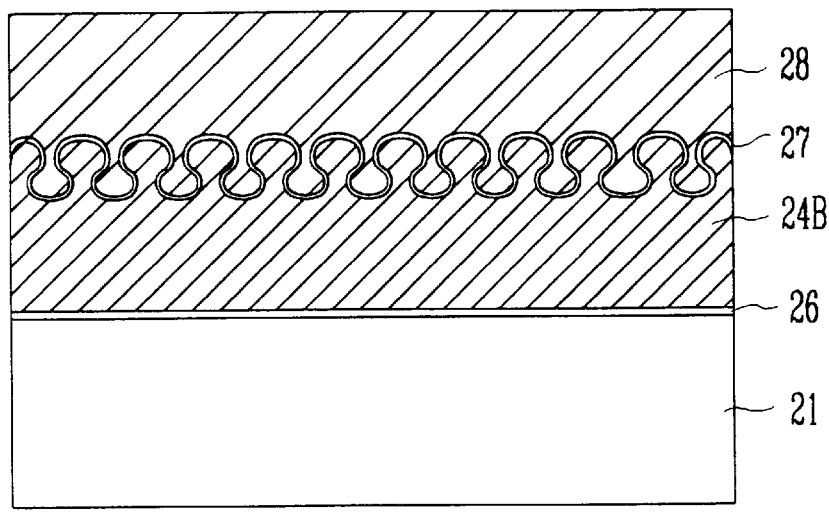
Figure 3F:
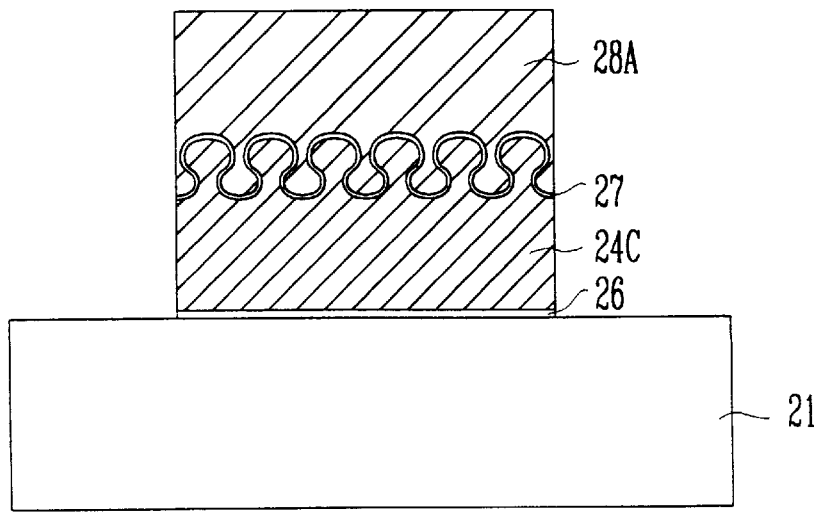

Referring to FIG. 3E and FIG. 3F, a dielectric film 27 and a polysilicon film 28 are formed sequentially on the silicon film 24B, and then the polysilicon film 28, the dielectric film 27, the silicon film 24B having the hemispherical roughness structure thereon and the oxide film 26 are patterned by a self alignment etching method, thereby forming a gate electrode consisted of a floating gate 24C and a control gate 28A.

As described above, the silicon seeds are formed on surface of the electrode and grown to grains so that the hemispherical roughness structure is formed at surface of the electrode. Therefore, the surface area of the electrode can be increased, thereby securing a sufficient capacitance in a narrow area of cell.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope and spirit of the present invention.

What is claimed is:

1. A method of forming an electrode of the flash memory device comprising the steps of;

forming an amorphous silicon film on a silicon substrate on which an oxide film is formed;

removing a native oxide film formed on said amorphous silicon film;

forming silicon seeds on said amorphous silicon film;

performing a heat treatment for growing said silicon seeds, thereby forming an hemispherical roughness structure on surface of said amorphous silicon film;

sequentially forming a dielectric film and polysilicon film on said amorphous silicon film; and patterning said polysilicon film, dielectric film and said amorphous silicon, thereby forming a gate electrode consisted of a floating gate and control gate.

2. The method of claim 1, wherein said amorphous silicon film is formed by use of at least one reaction gas of $Si_2H_6$ gas, $SiH_4$ gas, $Si_2H_6+PH_3$ gas, $SiH_4+PH_3$ gas, $Si_2H_6+AsH_3$ gas and $SiH_4+AsH_3$ gas.

3. The method of claim 1, wherein said native oxide film is etched by dry etching process using a mixed gas of HF gas and $H_2O$ or HF gas and $CH_3OH$ gas.

4. The method of claim 1, wherein said native oxide film is etched by wet etching process using an etchant of HF or BOE.

5. The method of claim 1, wherein said silicon seeds are formed in the furnace using $Si_2H_6$ gas or $SiH_4$ gas with flow rate of 10 through 100 sccm in condition of a pressure of 10E-9 through 10E-5 Torr and a temperature of 500 through 750 degree Celsius.

6. The method of claim 1, wherein said heat treatment for growing said silicon seeds is performed in condition of a pressure of 10E-9 through 10E-6 Torr and a temperature of 500 through 800 degree Celsius.

* * * * *